United States Patent
Kuang

(10) Patent No.: US 11,245,324 B2
(45) Date of Patent: Feb. 8, 2022

(54) SWITCHING CONVERTER AND A METHOD THEREOF

(71) Applicant: Chengdu Monolithic Power Systems Co., Ltd., Chengdu (CN)

(72) Inventor: Naixing Kuang, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 11 days.

(21) Appl. No.: 15/930,434

(22) Filed: May 12, 2020

(65) Prior Publication Data

US 2020/0381989 A1    Dec. 3, 2020

(30) Foreign Application Priority Data

May 29, 2019    (CN) .......................... 201910458319.1

(51) Int. Cl.
*H02M 1/08*    (2006.01)
*H02M 3/157*    (2006.01)
*H02M 3/158*    (2006.01)
*H02M 1/00*    (2006.01)
*H03K 19/017*    (2006.01)
*H02M 1/38*    (2007.01)

(52) U.S. Cl.
CPC ........... *H02M 1/08* (2013.01); *H02M 1/0006* (2021.05); *H02M 3/157* (2013.01); *H02M 3/158* (2013.01); *H03K 19/01714* (2013.01); *H02M 1/38* (2013.01)

(58) Field of Classification Search
CPC .......... H02M 1/38; H02M 1/08; H02M 3/156; H02M 3/157; H02M 3/158
See application file for complete search history.

(56) References Cited

U.S. PATENT DOCUMENTS

| | | | |
|---|---|---|---|
| 6,201,717 B1* | 3/2001 | Grant ................... | H02M 3/1588 363/60 |
| 8,970,185 B1* | 3/2015 | Sutardja .................. | H02M 1/08 323/266 |
| 9,779,827 B2 | 6/2017 | Zhang et al. | |
| 2005/0077950 A1 | 4/2005 | Robinson, Jr. | |
| 2010/0052648 A1* | 3/2010 | Iwabuchi ............. | H03K 17/063 323/351 |
| 2012/0293219 A1* | 11/2012 | Bai ...................... | H02M 3/1588 327/109 |
| 2020/0153427 A1* | 5/2020 | Bagheri ........... | H03K 19/09443 |
| 2020/0251976 A1* | 8/2020 | Jodka ................... | H03K 17/687 |

* cited by examiner

*Primary Examiner* — Alex Torres-Rivera
(74) *Attorney, Agent, or Firm* — Perkins Coie LLP

(57) ABSTRACT

A control circuit having: a logic circuit, configured to provide a high side boot-strap capacitor control signal set and a low side boot-strap capacitor control signal set; a high side boot-strap capacitor control circuit, configured to provide a high side power signal to control a high side power switch; a high side boot-strap capacitor, having a first terminal coupled to a control terminal of the high side power switch, and a second terminal coupled to the high side boot-strap capacitor control circuit; a low side boot-strap capacitor control circuit, configured to provide a low side power signal to control a low side power switch; and a low side boot-strap capacitor, having a first terminal coupled to a control terminal of the low side power switch, and a second terminal coupled to the low side boot-strap capacitor control circuit.

26 Claims, 9 Drawing Sheets

SWITCHING CONVERTER AND A METHOD THEREOF

CROSS-REFERENCE TO RELATED APPLICATIONS

This application claims priority to and the benefit of Chinese Patent Application No. 201910458319.1, filed on May 29, 2019, which is incorporated herein by reference in its entirety.

FIELD

The present invention relates generally to electronic circuits, and more particularly but not exclusively to a circuit controlling a switch and a method thereof.

BACKGROUND

A switching converter converts an input voltage to a required output voltage by controlling a duty cycle of at least one power switch. As persons of ordinary skill in the art know that, the power switch has a threshold voltage. When a control voltage at a control terminal of the power switch is higher than the threshold voltage, the power switch is on, vice versa.

In a real circuit, there are always parasitic components, e.g., parasitic inductance and parasitic capacitance, affecting the power switch's performance. FIG. 1 schematically shows a half-bridge circuit 10. The half-bridge circuit 10 comprises a high side power switch PM1 and a low side power switch PM2 coupled in series. The high side power switch PM1 and the low side power switch PM2 are turned on and off alternately by complementary control signals PWM_H and PWM_L. As shown in FIG. 1, when a gate-source voltage Vgsh of the high side power switch PM1 turns to high, the high side power switch PM1 is turned on. At this time, the low side power switch PM2 is supposed to be off. Unfortunately, a switching voltage Vsw at a connecting node of the high side power switch PM1 and the low side power switch PM2 will be pulled to high when the high side power switch PM1 is turned on, which causes a high voltage being coupled to a gate of the low side power switch PM2 via a parasitic drain gate capacitor Cgd_L, which further causes a spike of the gate-source voltage Vgsl of the low side power switch PM2.

With the development of the semiconductor technology, the threshold voltage of the power switch becomes lower and lower. When the low side power switch PM2 comprises a switch e.g., GaN device, with a low threshold, the spike at the gate-source voltage Vgsl may turn on the low side power switch PM2, which may create a through path from the power supply Vbus to a ground reference at a moment. A huge current will flow through the through path and damage the power switches PM1 and PM2.

SUMMARY

It is an object of the present invention to provide a control circuit suitable for controlling a controllable semiconductor device even with a low threshold voltage. The control circuit has simple structure, reliable performance, and could be adopted by switching converters with topologies like half bridge, full bridge, single phase, multi-phase, isolated or non-isolated circuit.

In accomplishing the above and other objects, there has been provided, in accordance with an embodiment of the present invention, a control circuit for controlling a high side power switch and a low side power switch, comprising: a logic circuit, configured to receive a high side control signal and a low side control signal, and to provide a high side boot-strap capacitor control signal set and a low side boot-strap capacitor control signal set based on the high side control signal and the low side control signal; a high side boot-strap capacitor control circuit, coupled between a high side power supply and a high side ground reference, wherein the high side boot-strap capacitor control circuit receives the high side boot-strap capacitor control signal set, and provides a high side power signal to a control terminal of the high side power switch; a high side boot-strap capacitor, having a first terminal coupled to the control terminal of the high side power switch, and a second terminal coupled to the high side boot-strap capacitor control circuit; a low side boot-strap capacitor control circuit, coupled between a low side power supply and a low side ground reference, wherein the low side boot-strap capacitor control circuit receives the low side boot-strap capacitor control signal set, and provides a low side power signal to a control terminal of the low side power switch; and a low side boot-strap capacitor, having a first terminal coupled to the control terminal of the low side power switch, and a second terminal coupled to the low side boot-strap capacitor control circuit.

In accomplishing the above and other objects, there has been provided, in accordance with an embodiment of the present invention, a switching converter, comprising: a high side power switch; a low side power switch; a logic circuit, configured to receive a high side control signal and a low side control signal, and to provide a high side boot-strap capacitor control signal set and a low side boot-strap capacitor control signal set based on the high side control signal and the low side control signal; a high side boot-strap capacitor control circuit, coupled between a high side power supply and a high side ground reference, wherein the high side boot-strap capacitor control circuit receives the high side boot-strap capacitor control signal set, and provides a high side power signal to a control terminal of the high side power switch; a high side boot-strap capacitor, having a first terminal coupled to the control terminal of the high side power switch, and a second terminal coupled to the high side boot-strap capacitor control circuit; a low side boot-strap capacitor control circuit, coupled between a low side power supply and a low side ground reference, wherein the low side boot-strap capacitor control circuit receives the low side boot-strap capacitor control signal set, and provides a low side power signal to a control terminal of the low side power switch; and a low side boot-strap capacitor, having a first terminal coupled to the control terminal of the low side power switch, and a second terminal coupled to the low side boot-strap capacitor control circuit.

In accomplishing the above and other objects, there has been provided, in accordance with an embodiment of the present invention, a control method of a power switch in a switching converter, wherein the switching converter comprises a complementary power switch turned on and off alternately with the power switch, comprising: coupling a first terminal of a capacitor to a control terminal of the power switch; keeping a voltage across the capacitor unchanged except for a time period during when the capacitor is charged; coupling a second terminal of the capacitor to a current source during a dead time of a switching period of the switching converter, wherein the dead time is a time period during when the power switch and the complementary power switch are both turned off; coupling the second terminal of the capacitor to a power supply during an on time period of the power switch; and coupling the second terminal of the capacitor to a ground reference during an off time period of the power switch; wherein the switching period of the switching converter comprises the on time period and the off time period of the power switch, and the dead time.

The use of the same reference label in different drawings indicates the same or like components.

DETAILED DESCRIPTION

In the present invention, numerous specific details are provided, such as examples of circuits, components, and methods, to provide a thorough understanding of embodiments of the invention. Persons of ordinary skill in the art would recognize, however, that the invention can be practiced without one or more of the specific details. In other instances, well-known details are not shown or described to avoid obscuring aspects of the invention.

Figure 1:
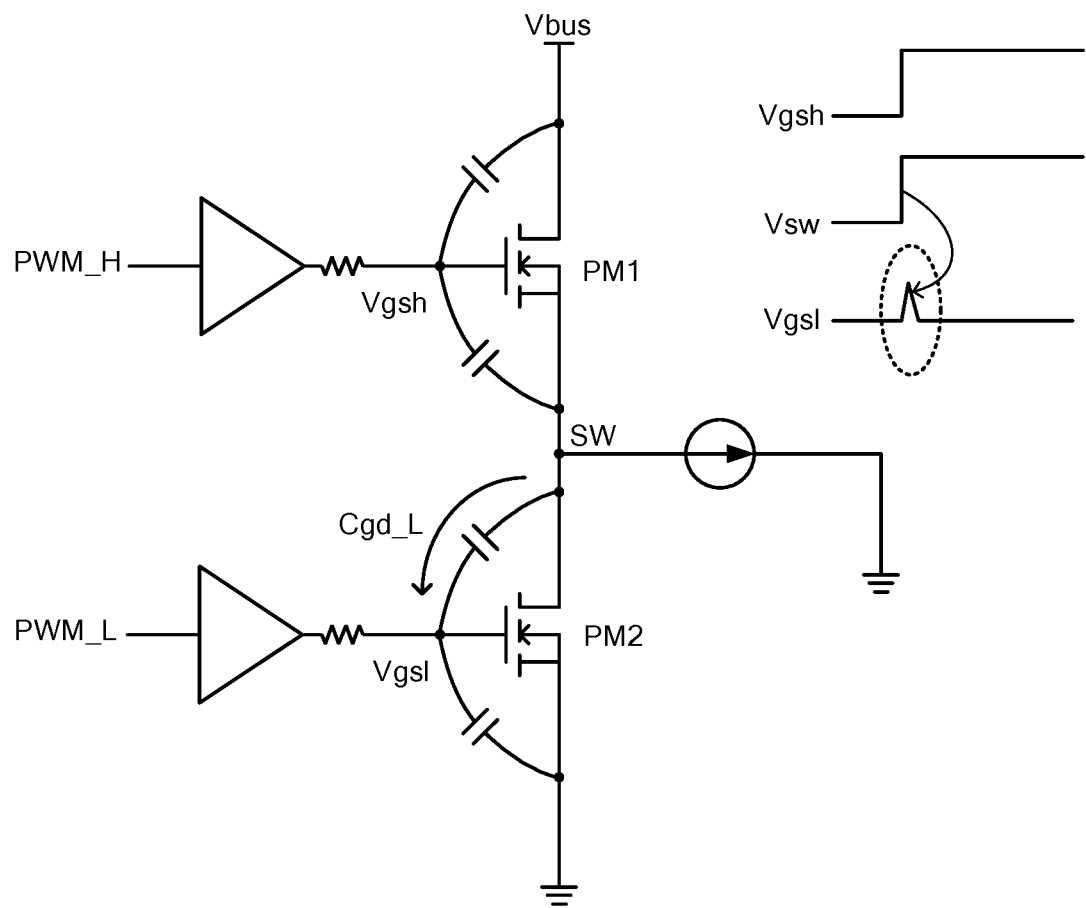
FIG. 1 schematically shows a prior art half-bridge circuit 10.
Figure 2:
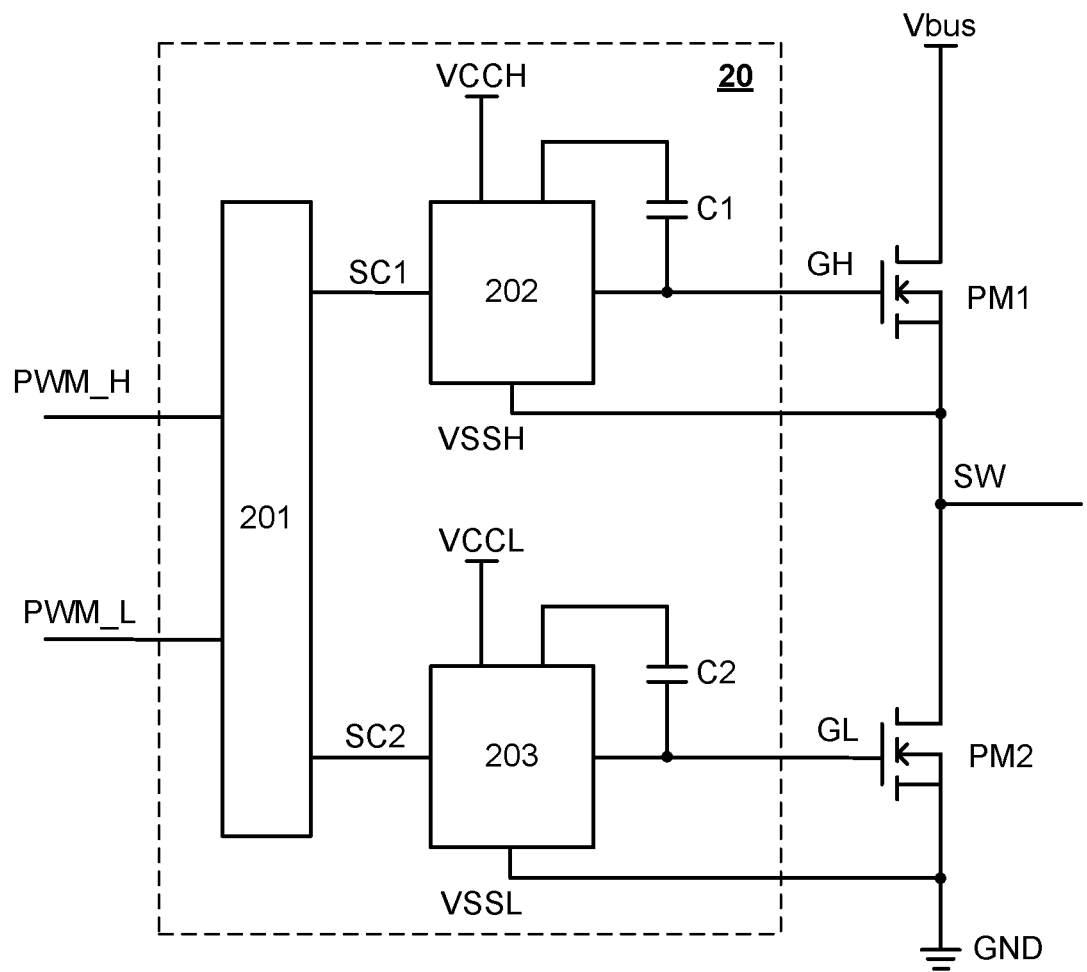
FIG. 2 schematically shows a control circuit 20 of a power switch in accordance with an embodiment of the present invention.

FIG. 2 schematically shows a control circuit 20 of a power switch in accordance with an embodiment of the present invention. The control circuit 20 receives a high side control signal PWM_H and a low side control signal PWM_L, and controls the high side power switch PM1 and the low side power switch PM2 to be on and off alternately based on the high side control signal PWM_H and the low side control signal PWM_L. The control circuit 20 comprises: a logic circuit 201, configured to receive the high side control signal PWM_H and the low side control signal PWM_L, and to provide a high side boot-strap capacitor control signal set SC1 and a low side boot-strap capacitor control signal set SC2 based on the high side control signal PWM_H and the low side control signal PWM_L; a high side boot-strap capacitor control circuit 202, coupled between the high side power supply VCCH and a high side ground reference VSSH, wherein the high side boot-strap capacitor control circuit 202 receives the high side boot-strap capacitor control signal set SC1, and provides a high side power signal GH to a control terminal of the high side power switch PM1; a high side boot-strap capacitor C1, having a first terminal coupled to the control terminal of the high side power switch PM1, and a second terminal coupled to the high side boot-strap capacitor control circuit 202; a low side boot-strap capacitor control circuit 203, coupled between a low side power supply VCCL and a low side ground reference VSSL, wherein the low side boot-strap capacitor control circuit 203 receives the low side boot-strap capacitor control signal set SC2, and provides a low side power signal GL to a control terminal of the low side power switch PM2; and a low side boot-strap capacitor C2, having a first terminal coupled to the control terminal of the low side power switch PM2, and a second terminal coupled to the low side boot-strap capacitor control circuit 203. In the embodiment of FIG. 2, the high side ground reference VSSH is coupled to a connecting node of the high side power switch PM1 and the low side power switch PM2, i.e., a switching node SW. The low side ground reference VSSL is coupled to a ground reference GND.

It should be understood that, the high side boot-strap capacitor control signal set SC1 may comprise a single signal, or may comprise a plurality of signals to control the high side boot-strap capacitor C1 via the high side boot-strap capacitor control circuit 202. Similarly, the low side boot-strap capacitor control signal set SC2 may comprise a single signal, or may comprise a plurality of signals to control the low side boot-strap capacitor C2 via the low side boot-strap capacitor control circuit 203.

Figure 3:
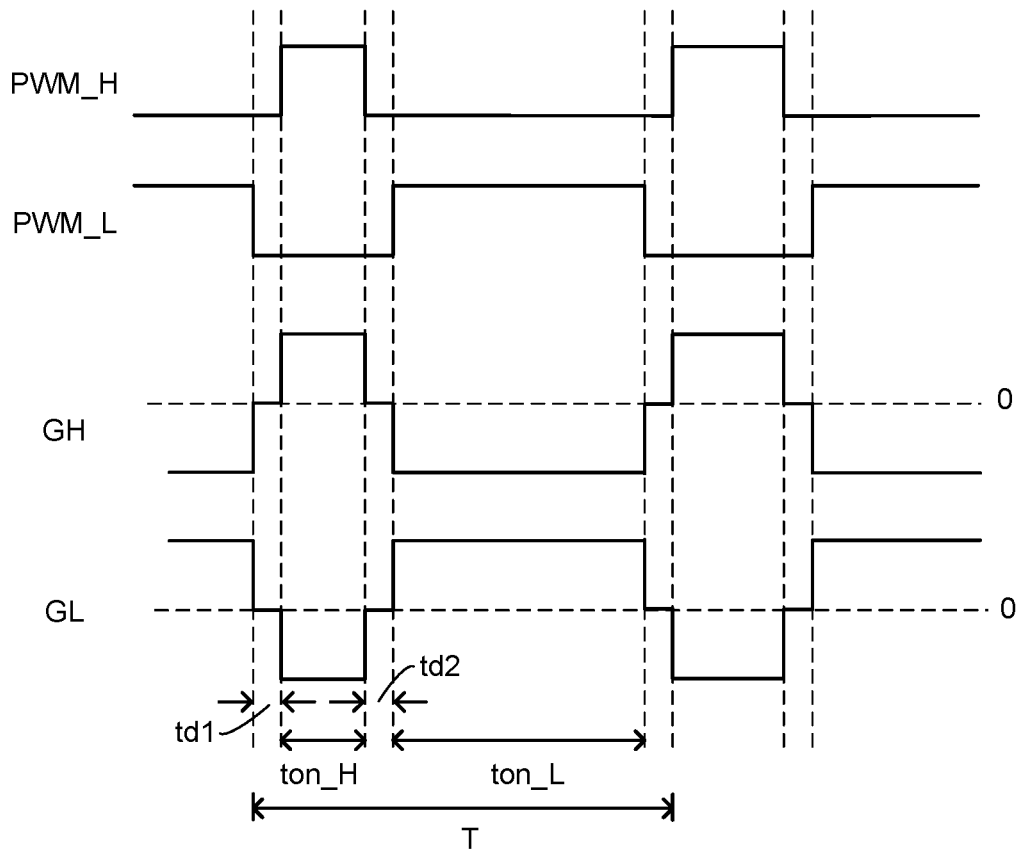
FIG. 3 schematically shows waveforms of the high side control signal PWM_H, the low side control signal PWM_L, the high side power signal GH and the low side power signal GL in accordance with an embodiment of the present invention.

FIG. 3 schematically shows waveforms of the high side control signal PWM_H, the low side control signal PWM_L, the high side power signal GH and the low side power signal GL in accordance with an embodiment of the present invention. As shown in FIG. 3, a single switching period T comprises dead times td1 and td2, an on time period ton_H of the high side power switch PM1 and an on time period ton_L of the low side power switch PM2.

Figure 4:
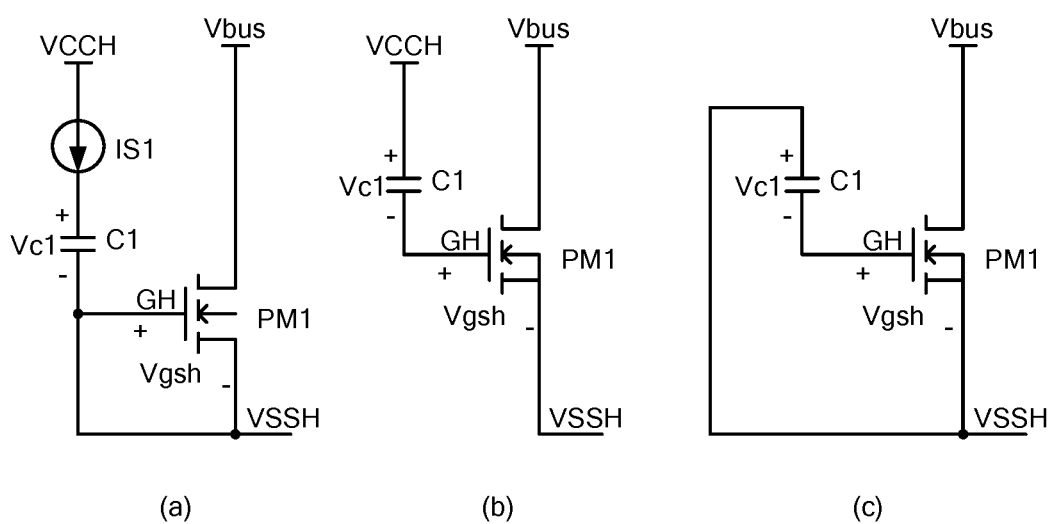
FIG. 4 schematically shows connections between the high side power switch PM1 and the high side boot-strap capacitor C1 during different time periods of a single switching period in accordance with an embodiment of the present invention.

FIG. 4 schematically shows connections between the high side power switch PM1 and the high side boot-strap capacitor C1 during different time periods of a single switching period T in accordance with an embodiment of the present invention. The operation of the control circuit 20 will be illustrated with reference to FIGS. 2-4.

FIG. 4(a) schematically shows the connection between the high side power switch PM1 and the high side boot-strap capacitor C1 during the dead times td1 and td2 in accordance with an embodiment of the present invention. During the dead times td1 and td2, the high side control signal PWM_H and the low side control signal PWM_L are both logic low, i.e., the high side power switch PM1 and the low side power switch PM2 are both turned off. At this time, a first terminal of the capacitor C1 is coupled to the control terminal of high side power switch PM1, and a second terminal of the capacitor C1 is coupled to the high side power supply VCCH via a first current source IS1, wherein the first current source IS1 charges the high side boot-strap capacitor C1. The control terminal of the high side power switch PM1 is coupled to the high side ground reference VSSH, which means GH=0, and Vgsh=0. As a result, the high side power switch PM1 is off.

FIG. 4(b) schematically shows the connection between the high side power switch PM1 and the high side boot-strap capacitor C1 during the on time period ton_H of the high side power switch PM1 in accordance with an embodiment of the present invention. During the on time period ton_H, GH=1. As shown in FIG. 4(b), and Vgsh=VCCH−Vc1.

FIG. 4(c) schematically shows the connection between the high side power switch PM1 and the high side boot-strap capacitor C1 during the on time period ton_L of the low side power switch PM2 in accordance with an embodiment of the present invention. During the on time period ton_L, the control terminal of the high side power switch PM1 is coupled to the high side ground reference VSSH via the high side boot-strap capacitor C1, and GH=Vgsh=−Vc1, which means the high side power switch PM1 is turned off by a negative voltage −Vc1. During this time, even if the threshold voltage of the high side power switch PM1 is very low, the effect caused by the spike coupled to the control terminal of the high side power switch PM1 via the parasitic components could be alleviated.

Figure 5:
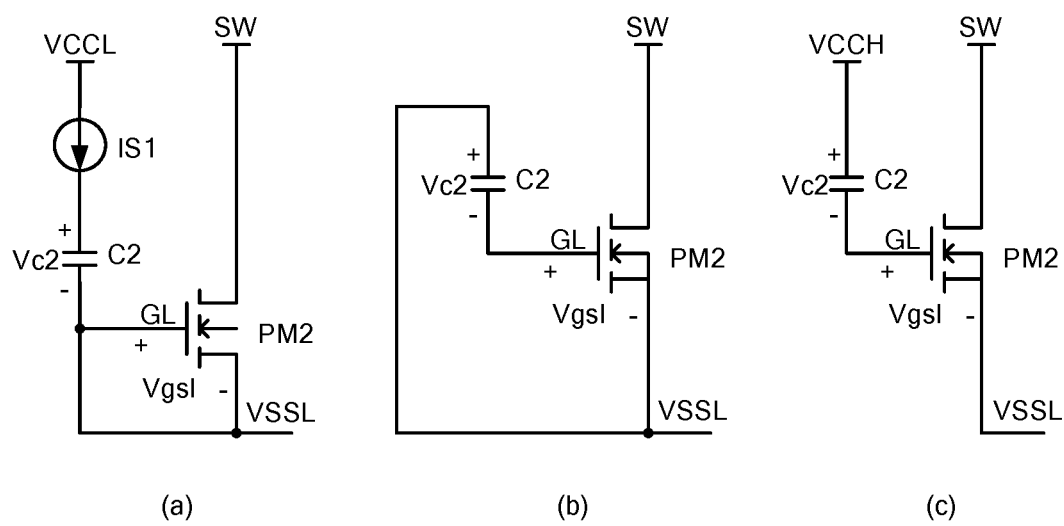
FIG. 5 schematically shows connections between the low side power switch PM2 and the low side boot-strap capacitor C2 during different time periods of a single switching period in accordance with an embodiment of the present invention.

FIG. 5 schematically shows connections between the low side power switch PM2 and the low side boot-strap capacitor C2 during different time periods of a single switching period T in accordance with an embodiment of the present invention. The operation of the control circuit 20 will be illustrated with reference to FIGS. 2, 3 and 5.

FIG. 5(a) schematically shows the connection between the low side power switch PM2 and the low side boot-strap capacitor C2 during the dead times td1 and td2 in accordance with an embodiment of the present invention. During the dead times td1 and td2, a first terminal of the capacitor C2 is coupled to the low side power supply VCCL via a second current source IS1, and a second terminal of the capacitor C2 is coupled to the control terminal of the low side power switch PM2, wherein the second current source IS2 charges the low side boot-strap capacitor C2. During this time, the control terminal of the low side power switch PM2 is coupled to the low side ground reference VSSL, which means GL=0, and Vgsl=0. As a result, the low side power switch PM2 is off.

FIG. 5(b) schematically shows the connection between the low side power switch PM2 and the low side boot-strap capacitor C2 during the on time period ton_H of the high side power switch PM1 in accordance with an embodiment of the present invention. During the on time period ton_H, the control terminal of the low side power switch PM2 is coupled to the low side ground reference VSSL via the low side boot-strap capacitor C2, and GL=Vgsl=−Vc2, which means the low side power switch PM2 is turned off by a negative voltage −Vc2. During this time, even if the threshold voltage of the low side power switch PM2 is very low, the effect caused by the spike coupled to the control terminal of the low side power switch PM2 via the parasitic components could be alleviated.

FIG. 5(c) schematically shows the connection between the low side power switch PM2 and the low side boot-strap capacitor C2 during the on time period ton_L of the low side power switch PM2 in accordance with an embodiment of the present invention. During the on time period ton_L, Vgsl=VCCL−Vc2.

Figure 6:
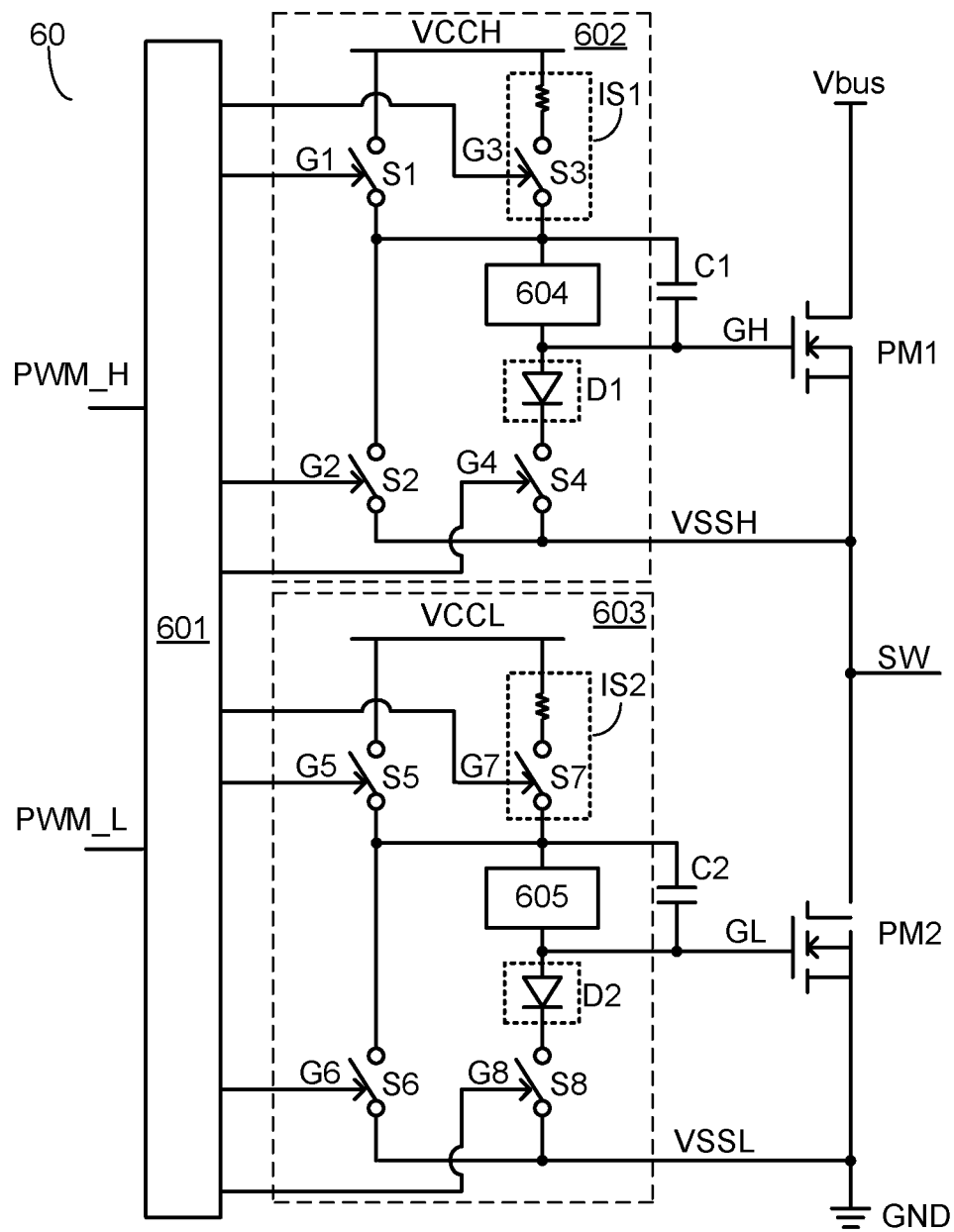
FIG. 6 schematically shows a control circuit 60 in accordance with an embodiment of the present invention.

FIG. 6 schematically shows a control circuit 60 in accordance with an embodiment of the present invention. The control circuit 60 comprises: a logic circuit 601, configured to receive the high side control signal PWM_H and the low side control signal PWM_L, and to provide a first switching signal G1, a second switching signal G2, a third switching signal G3, a fourth switching signal G4, a fifth switching signal G5, a sixth switching signal G6, a seventh switching signal G7 and an eighth switching signal G8 based on the high side control signal PWM_H and the low side control signal PWM_L; a high side boot-strap capacitor control circuit 602, coupled between the high side power supply VCCH and the high side ground reference VSSH, having a first input terminal, a second input terminal, a third input terminal, a fourth input terminal, a first output terminal, and a second output terminal, wherein the four input terminals are configured to receive the switching signals G1-G4 respectively, the first output terminal and the second output terminal are coupled to the first terminal and the second terminal of the high side boot-strap capacitor C1 respectively; the high side boot-strap capacitor C1, having the first terminal and the second terminal coupled to the first output terminal and the second output terminal of the high side boot-strap capacitor control circuit 602 respectively, and the first terminal of the high side boot-strap capacitor C1 is further coupled to the control terminal of the high side power switch PM1; a low side boot-strap capacitor control circuit 603, coupled between the low side power supply VCCL and the low side ground reference VSSL, having a first input terminal, a second input terminal, a third input terminal, a fourth input terminal, a first output terminal and a second output terminal, wherein the four input terminals are configured to receive the switching signals G5-G8 respectively, and the first output terminal and the second output terminal are coupled to the first terminal and the second terminal of the low side boot-strap capacitor C2 respectively; and the low side boot-strap capacitor C2, having the first terminal and the second terminal coupled to the first output terminal and the second output terminal of the low side boot-strap capacitor control circuit 603 respectively, and the first terminal of the low side boot-strap capacitor C2 is further coupled to the control terminal of the low side power switch PM2.

In the example of FIG. 6, the high side boot-strap capacitor control circuit 602 comprises: a first switch S1, coupled between the high side power supply VCCH and the second terminal of the high side boot-strap capacitor C1, wherein the first switch S1 has a control terminal configured to receive the first switching signal G1; a second switch S2, coupled between the second terminal of the high side boot-strap capacitor C1 and the high side ground reference VSSH, and wherein the second switch S2 has a control terminal configured to receive the second switching signal G2; the first current source IS1, coupled between the high side power supply VCCH and the second terminal of the high side boot-strap capacitor C1, wherein the first current source IS1 has a control terminal configured to receive the third switching signal G3; a fourth switch S4, coupled between the first terminal of the high side boot-strap capacitor C1 and the high side ground reference VSSH, wherein the fourth switch S4 has a control terminal configured to receive the fourth switching signal G4; and a first clamping circuit 604, coupled in parallel with the high side boot-strap capacitor C1, wherein the first clamping circuit 604 keeps a voltage across the high side boot-strap capacitor C1 unchanged except for a time period during when the high side boot-strap capacitor C1 is charged by the first current source IS1. In FIG. 6, the first current source IS1 comprises a resistor R1 and the third switch S3 coupled in series, wherein the control terminal of the third switch S3 is configured to receive the third switching signal G3. In other embodiments, the first current source IS1 could comprise a single switch with a required on resistance.

In the example of FIG. 6, the low side boot-strap capacitor control circuit 603 comprises: a fifth switch S5, coupled between the low side power supply VCCL and the second terminal of the low side boot-strap capacitor C2, wherein the fifth switch S5 has a control terminal configured to receive the fifth switching signal G5; a sixth switch S6, coupled between the second terminal of the low side boot-strap capacitor C6 and the low side ground reference VSSL, and wherein the sixth switch S6 has a control terminal configured to receive the sixth switching signal G6; the second current source IS2, coupled between the low side power supply VCCL and the second terminal of the low side boot-strap capacitor C2, wherein the second current source IS2 has a control terminal configured to receive the seventh switching signal G7; an eighth switch S8, coupled between the first terminal of the low side boot-strap capacitor C2 and the low side ground reference VSSL, wherein the eighth switch S8 has a control terminal configured to receive the eighth switching signal G8; and a second clamping circuit 605, coupled in parallel with the low side boot-strap capacitor C2, wherein the second clamping circuit 605 keeps a voltage across the low side boot-strap capacitor C2 unchanged except for a time period during when the low side boot-strap capacitor C2 is charged by the second current source IS2. In FIG. 6, the second current source IS2 comprises a resistor R2 and the seventh switch S7 coupled in series, wherein the control terminal of the seventh switch S7 is configured to receive the seventh switching signal G7. In other embodiments, the second current source IS2 could comprise a single switch with a required on resistance.

Figure 7:
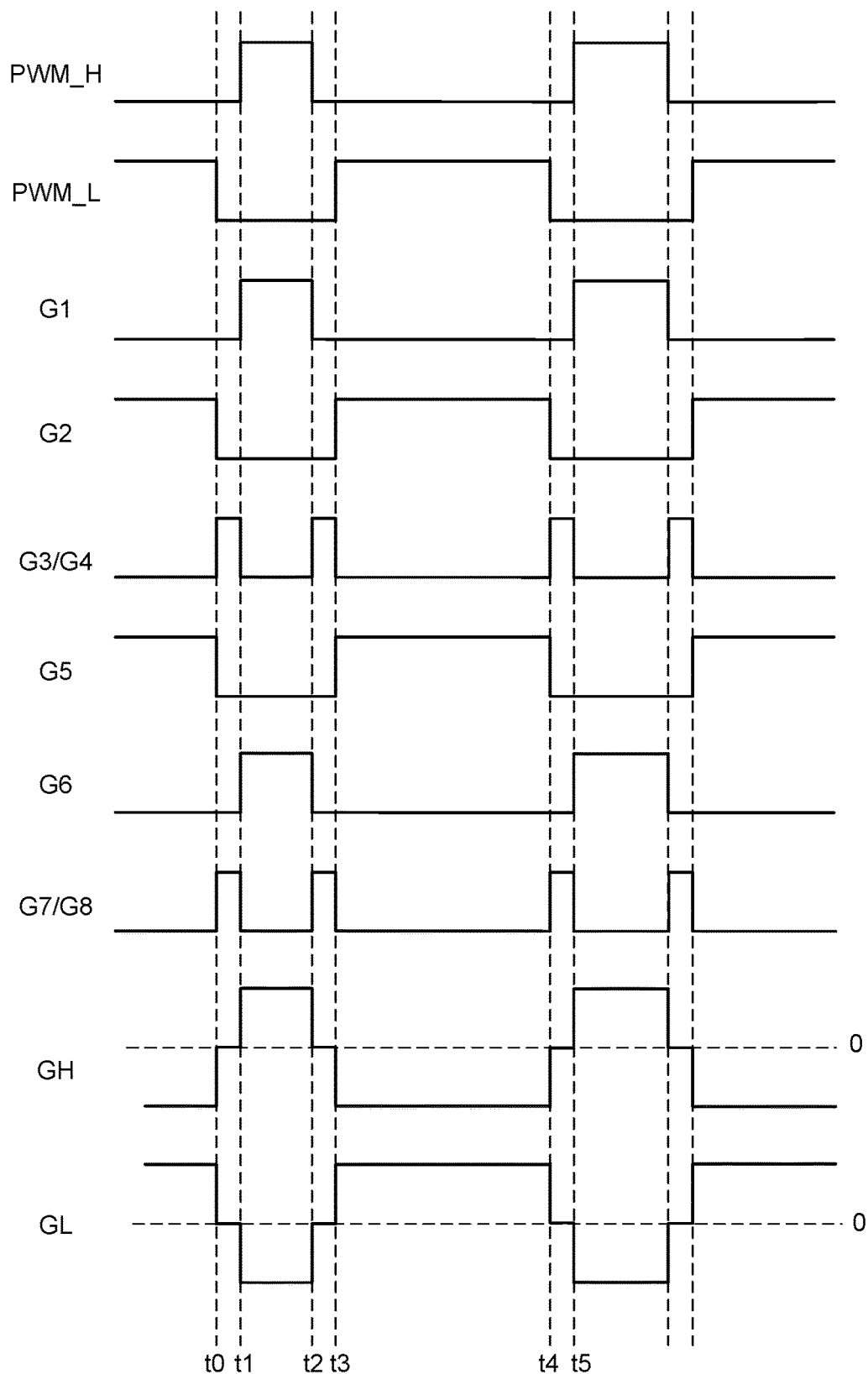
FIG. 7 schematically shows waveforms of the signals in FIG. 6 in accordance with an embodiment of the present invention.

FIG. 7 schematically shows waveforms of the signals in FIG. 6 in accordance with an embodiment of the present invention. The operation of the high side boot-strap capacitor control circuit 602 in FIG. 6 is illustrated with reference to FIGS. 6 and 7.

In the embodiment of FIG. 7, the switches G1-G8 are turned on by a high voltage, and are turned off by a low voltage. The logic circuit 601 receives the high side control signal PWM_H and the low side control signal PWM_L. After a logic operation to the high side control signal PWM_H and the low side control signal PWM_L, the logic circuit 601 provides the switching signals G1-G8, to control the switches S1-S8 respectively. As shown in FIG. 7, during a dead time t0-t1, the first switch S1 and the second switch S2 are turned off, and the third switch S3 and the fourth switch S4 are turned on. As a result, the high side power signal GH is pulled to the high side ground reference VSSH by the third switch S4, i.e., GH=0. Meanwhile, the high side boot-strap capacitor C1 is charged by the first current source IS1. During time period t1-t2, the first switch S1 is on, the second switch S2, the third switch S3 and the fourth switch S4 are turned off, the control terminal of the high side power switch PM1 is coupled to the high side power supply VCCH via the first switch S1, i.e., GH=VCCH−Vc1, and the high side power switch PM1 is turned on. During the dead time t2-t3, the operations of the switches S1-S4 are similar with the operation that during the time period t0-t1. During the time period t3-t4, the first switch S1, the third switch S3 and the fourth switch S4 are turned off, and the second switch S2 is turned on. As a result, the second terminal of the high side boot-strap capacitor C1 is coupled to the high side ground reference VSSH, i.e., GH=−Vc1, and the high side power switch PM1 is turned off by a negative voltage. From time t4, another switching period begins, and the operation of the high side boot-strap capacitor control circuit 602 repeats.

In one embodiment, each one of the fourth switch S4 and the eighth switch S8 comprises a MOSFET (Metal-Oxide-Semiconductor Field Effect Transistor) having a body diode. The high side boot-strap capacitor control circuit 602 further comprises a diode D1, having an anode terminal coupled to the first terminal of the high side boot-strap capacitor C1, and a cathode terminal coupled to the fourth switch S4, to prevent the body diode of the fourth switch S4 from being turned on when the voltage at the control terminal of the high side power switch PM1 is negative. The low side boot-strap capacitor control circuit 603 comprises a diode D2, having an anode terminal coupled to the first terminal of the low side boot-strap capacitor C2, and a cathode terminal coupled to the eighth switch S8, to prevent the body diode of the eighth switch S8 from being turned on when the voltage at the control terminal of the low side power switch PM2 is negative.

In other embodiments, if the fourth switch S4 and the eighth switch S8 comprise no body diode, the diodes D1 and D2 could be omitted.

The operation of the low side boot-strap capacitor control circuit 603 is similar with the operation of the high side boot-strap capacitor control circuit 602, and is not described here for brevity.

Figure 8:
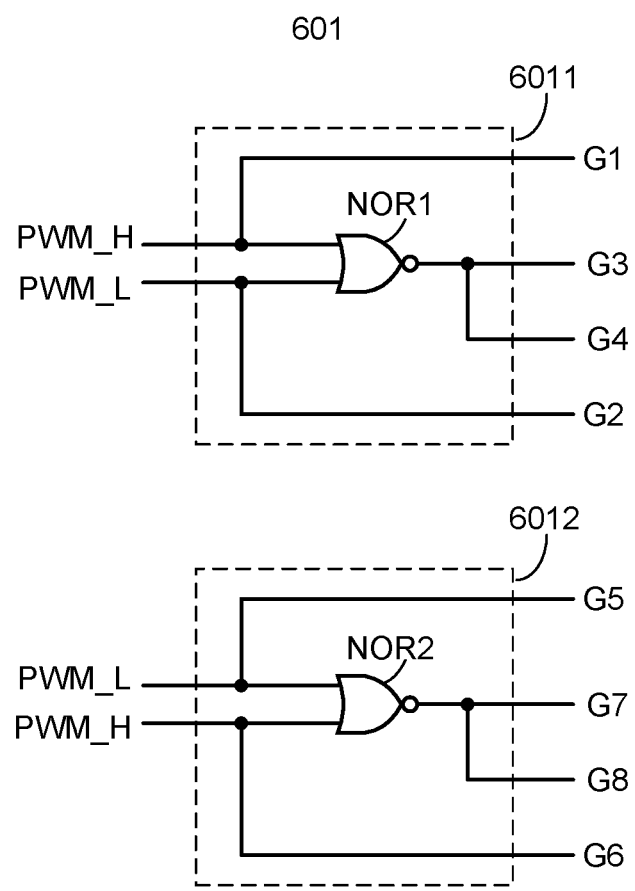
FIG. 8 schematically shows the logic circuit 601 in accordance with an embodiment of the present invention.

FIG. 8 schematically shows the logic circuit 601 in accordance with an embodiment of the present invention. As shown in FIG. 8, the logic circuit 601 comprises a high side logic circuit 6011 and a low side logic circuit 6012.

The high side logic circuit 6011 comprises a first NOR gate NOR1. As shown in FIG. 8, the first switching signal G1 has a same phase with the high side control signal PWM_H, and the second switching signal G2 has a same phase with the low side control signal PWM_L. The first NOR gate NOR1 receives the high side control signal PWM_H and the low side control signal PWM_L, and provides the third switching signal G3 and the fourth switching signal G4.

The low side logic circuit 6012 comprises a second NOR gate NOR2. As shown in FIG. 8, the fifth switching signal G5 has a same phase with the low side control signal PWM_L, and the sixth switching signal G6 has a same phase with the high side control signal PWM_H. The second NOR gate NOR2 receives the high side control signal PWM_H and the low side control signal PWM_L, and provides the seventh switching signal G7 and the eighth switching signal G8.

The waveforms of the switching signals G1-G8 are shown in FIG. 7.

It should be understood that, the structure of the logic circuit should be adjusted according to the signal forms in real application. The logic circuit in FIG. 8 is for illustration, not for limitation. Furthermore, persons of ordinary skill in the art could generate the logic circuit by describing the function of the logic circuits with hardware description language, e.g., Verilog or VHDL (Very High Speed Integrated Circuits Hardware Description Language), in the light of the present invention.

Figure 9:
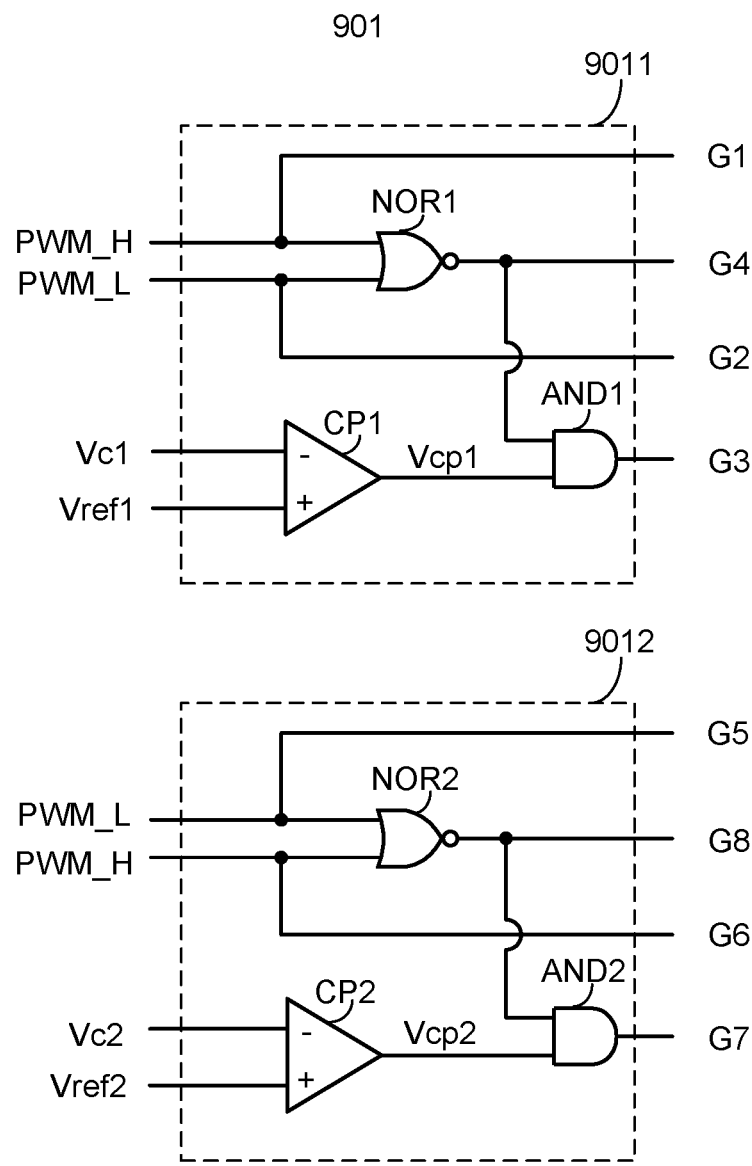
FIG. 9 schematically shows a logic circuit 901 in accordance with an embodiment of the present invention.

FIG. 9 schematically shows a logic circuit 901 in accordance with an embodiment of the present invention. In some embodiments, the logic circuit 601 could be replaced with the logic circuit 901. The logic circuit 901 comprises a high side logic circuit 9011 and a low side logic circuit 9012.

The high side logic circuit 9011 comprises: the first NOR gate NOR1, configured to receive the high side control signal PWM_H and the low side control signal PWM_L, and to provide the fourth switching signal G4; a first comparator CP1, configured to receive the high side boot-strap capacitor voltage Vc1 and a first reference voltage Vref1, and to provide a first comparing signal Vcp1 based on a comparison result of the high side boot-strap capacitor voltage Vc1 and the first reference voltage Vref1; and a first AND gate AND1, configured to receive the fourth switching signal G4 and the first comparing signal Vcp1, and to provide the third switching signal G3 based on an AND operation result of the fourth switching signal G4 and the first comparing signal Vcp1; wherein, the first switching signal G1 has a same phase with the high side control signal PWM_H, and the second switching signal G2 has a same phase with the low side control signal PWM_L.

The low side logic circuit 9012 comprises: the second NOR gate NOR2, configured to receive the high side control signal PWM_H and the low side control signal PWM_L, and to provide the eighth switching signal G8; a second comparator CP2, configured to receive the low side boot-strap capacitor voltage Vc2 and a second reference voltage Vref2, and to provide a second comparing signal Vcp2 based on a comparison result of the low side boot-strap capacitor voltage Vc2 and the second reference voltage Vref2; and a second AND gate AND2, configured to receive the eighth switching signal G8 and the second comparing signal Vcp2, and to provide the seventh switching signal G7 based on an AND operation result of the eighth switching signal G8 and the second comparing signal Vcp2; wherein, the fifth switching signal G5 has a same phase with the low side control signal PWM_L, and the sixth switching signal G6 has a same phase with the high side control signal PWM_H.

In the example of FIG. 9, when the high side boot-strap capacitor voltage Vc1 reaches the first reference voltage Vref1, the first comparator CP1 flips, and provides a low comparing signal Vcp1, to pull down the third switching signal G3. When the high side boot-strap capacitor voltage Vc1 is below the first reference voltage Vref1, the first comparator CP1 provides a high comparing signal Vcp1, then the third switching signal G3 and the fourth switching signal G4 have the same phase. When the low side boot-strap capacitor voltage Vc2 reaches the second reference voltage Vref2, the second comparator CP2 flips, and provides a low comparing signal Vcp2, to pull down the seventh switching signal G7. When the low side boot-strap capacitor voltage Vc2 is below the second reference voltage Vref2, the second comparator CP2 provides a high comparing signal Vcp2, then the seventh switching signal G7 and the eighth switching signal G8 have the same phase.

In the embodiment of FIG. 9, the waveforms of the third switching signal G3 and the fourth switching signal G4 generated by the logic circuit 901 may be different from the waveforms of the third switching signal G3 and the fourth switching signal G4 shown in FIG. 7, while the waveforms of the other switching signals G1, G2, G5-G8 generated by the logic circuit 901 are the same with the waveforms shown in FIG. 7. In FIG. 9, when the high side boot-strap capacitor voltage Vc1 reaches the first reference voltage Vref1, the third switching signal G3 goes low, which means the logic high duration of the third switching signal G3 may be shortened compared with the waveform shown in FIG. 7. Similarly, when the low side boot-strap capacitor voltage Vc2 reaches the second reference voltage Vref2, the seventh switching signal G7 goes low, which means the logic high duration of the seventh switching signal G7 may be shortened compared with the waveform shown in FIG. 7.

Figure 10:
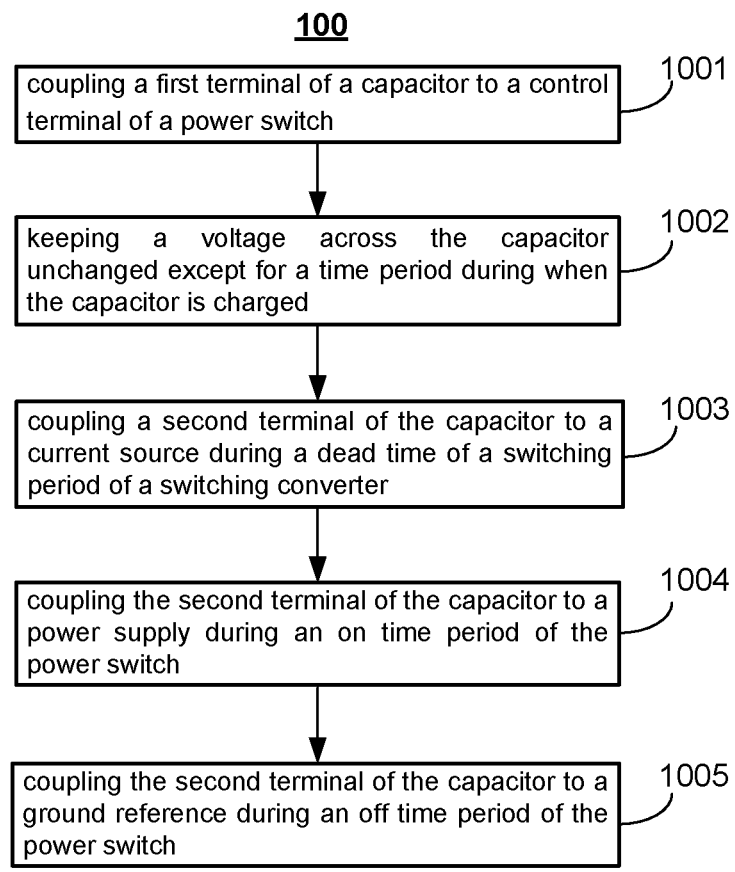
FIG. 10 schematically shows a control method 100 of a switch in accordance with an embodiment of the present invention.

FIG. 10 schematically shows a control method 100 of a switch in accordance with an embodiment of the present invention. The control method 100 could be adopted to drive a power switch in a switching converter, wherein the power switch could be coupled with a complementary power switch in a half-bridge, or the power switch could be coupled with the complementary power switch and other power switches in a full-bridge topology. The complementary power switch is turned on and off alternately with the power switch. The said half-bridge or full-bridge topology could be a power block of a single phase switching converter, or could be a power block of a multi-phase switching converter. Also, the said half-bridge and the said full-bridge topology could be applied in an isolated or non-isolated switching converter.

The control method 100 comprises:

Step 1001, coupling a first terminal of a capacitor to a control terminal of a power switch;

Step 1002, keeping a voltage across the capacitor unchanged;

Step 1003, coupling a second terminal of the capacitor to a current source during a dead time of a switching period of the switching converter, wherein the dead time of the switching period is a time period during when the power switch and the complementary power switch are both turned off;

Step 1004, coupling the second terminal of the capacitor to a power supply during an on time period of the power switch;

Step 1005, coupling the second terminal of the capacitor to a ground reference during an off time period of the power switch;

Wherein the switching period of the switching converter comprises the dead time, the on time period and the off time period of the power switch.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously would be resorted to by those skilled in the art without departing from the spirit and the scope of the invention as hereinafter defined by the appended claims as only a preferred embodiment(s) thereof has been disclosed.

What is claimed is:

1. A control circuit for controlling a high side power switch and a low side power switch, comprising:
   a logic circuit, configured to receive a high side control signal and a low side control signal, and to provide a high side boot-strap capacitor control signal set and a low side boot-strap capacitor control signal set based on the high side control signal and the low side control signal;
   a high side boot-strap capacitor control circuit, coupled between a high side power supply and a high side ground reference, wherein the high side boot-strap capacitor control circuit receives the high side boot-strap capacitor control signal set, and provides a high side power signal to a control terminal of the high side power switch;
   a high side boot-strap capacitor, having a first terminal coupled to the control terminal of the high side power switch, and a second terminal coupled to the high side boot-strap capacitor control circuit, wherein during a dead time of a switching period, the first terminal of the high side boot-strap capacitor is coupled to the high side ground reference, and the second terminal of the high side boot-strap capacitor is coupled to a first current source, and wherein the dead time is a time period during when the high side power switch and the low side power switch are both turned off;

a low side boot-strap capacitor control circuit, coupled between a low side power supply and a low side ground reference, wherein the low side boot-strap capacitor control circuit receives the low side boot-strap capacitor control signal set, and provides a low side power signal to a control terminal of the low side power switch; and a low side boot-strap capacitor, having a first terminal coupled to the control terminal of the low side power switch, and a second terminal coupled to the low side boot-strap capacitor control circuit, wherein during the dead time of the switching period, the first terminal of the low side boot-strap capacitor is coupled to the low side ground reference, and the second terminal of the low side boot-strap capacitor is coupled to a second current source.

2. The control circuit of claim 1, wherein the high side boot-strap capacitor control signal set comprises a first switching signal, a second switching signal, a third switching signal and a fourth switching signal, and wherein the high side boot-strap capacitor control circuit comprises:

a first switch, coupled between the high side power supply and the second terminal of the high side boot-strap capacitor, wherein the first switch has a control terminal configured to receive the first switching signal;

a second switch, coupled between the second terminal of the high side boot-strap capacitor and the high side ground reference, and wherein the second switch has a control terminal configured to receive the second switching signal;

the first current source, coupled between the high side power supply and the second terminal of the high side boot-strap capacitor, wherein the first current source has a control terminal configured to receive the third switching signal;

a fourth switch, coupled between the first terminal of the high side boot-strap capacitor and the high side ground reference, wherein the fourth switch has a control terminal configured to receive the fourth switching signal; and a first clamping circuit, coupled in parallel with the high side boot-strap capacitor, wherein the first clamping circuit keeps a voltage across the high side boot-strap capacitor unchanged except for a time period during when the high side boot-strap capacitor is charged by the first current source.

3. The control circuit of claim 2, wherein the first current source comprises a third switch having a control terminal configured to receive the third switching signal.

4. The control circuit of claim 3, wherein the first current source further comprises a resistor, coupled in series with the third switch.

5. The control circuit of claim 2, wherein the first switching signal has a same phase with the high side control signal, and the second switching signal has a same phase with the low side control signal, and wherein the logic circuit comprises:

a first NOR gate, configured to receive the high side control signal and the low side control signal, and to provide the third switching signal and the fourth switching signal.

6. The control circuit of claim 2, wherein the first switching signal has a same phase with the high side control signal, and the second switching signal has a same phase with the low side control signal, and wherein the logic circuit comprises:

a first NOR gate, configured to receive the high side control signal and the low side control signal, and to provide the fourth switching signal;

a first comparator, configured to receive a high side boot-strap capacitor voltage and a first reference voltage, and to provide a first comparing signal based on a comparison result of the high side boot-strap capacitor voltage and the first reference voltage; and a first AND gate, configured to receive the fourth switching signal and the first comparing signal, and to provide the third switching signal.

7. The control circuit of claim 1, wherein the low side boot-strap capacitor control signal set comprises a fifth switching signal, a sixth switching signal, a seventh switching signal and an eighth switching signal, and wherein the low side boot-strap capacitor control circuit comprises:

a fifth switch, coupled between the low side power supply and the second terminal of the low side boot-strap capacitor, wherein the fifth switch has a control terminal configured to receive the fifth switching signal;

a sixth switch, coupled between the second terminal of the low side boot-strap capacitor and the low side ground reference, and wherein the sixth switch has a control terminal configured to receive the sixth switching signal;

the second current source, coupled between the low side power supply and the second terminal of the low side boot-strap capacitor, wherein the second current source has a control terminal configured to receive the seventh switching signal;

an eighth switch, coupled between the first terminal of the low side boot-strap capacitor and the low side ground reference, wherein the eighth switch has a control terminal configured to receive the eighth switching signal; and a second clamping circuit, coupled in parallel with the low side boot-strap capacitor, wherein the second clamping circuit keeps a voltage across the low side boot-strap capacitor unchanged except for a time period during when the low side boot-strap capacitor is charged by the second current source.

8. The control circuit of claim 7, wherein the second current source comprises a seventh switch having a control terminal configured to receive the seventh switching signal.

9. The control circuit of claim 8, wherein the second current source further comprises a resistor, coupled in series with the seventh switch.

10. The control circuit of claim 7, wherein the sixth switching signal has a same phase with the high side control signal, and the fifth switching signal has a same phase with the low side control signal, and wherein the logic circuit comprises:

a second NOR gate, configured to receive the high side control signal and the low side control signal, and to provide the seventh switching signal and the eighth switching signal.

11. The control circuit of claim 7, wherein the sixth switching signal has a same phase with the high side control signal, and the seventh switching signal has a same phase with the low side control signal, and wherein the logic circuit comprises:

a second NOR gate, configured to receive the high side control signal and the low side control signal, and to provide the eighth switching signal;

a second comparator, configured to receive a low side boot-strap capacitor voltage and a second reference voltage, and to provide a second comparing signal based on a comparison result of the low side boot-strap capacitor voltage and the second reference voltage; and a second AND gate, configured to receive the eighth switching signal and the second comparing signal, and to provide the seventh switching signal.

12. A switching converter, comprising:

a high side power switch;

a low side power switch;

a logic circuit, configured to receive a high side control signal and a low side control signal, and to provide a high side boot-strap capacitor control signal set and a low side boot-strap capacitor control signal set based on the high side control signal and the low side control signal;

a high side boot-strap capacitor control circuit, coupled between a high side power supply and a high side ground reference, wherein the high side boot-strap capacitor control circuit receives the high side boot-strap capacitor control signal set, and provides a high side power signal to a control terminal of the high side power switch;

a high side boot-strap capacitor, having a first terminal coupled to the control terminal of the high side power switch, and a second terminal coupled to the high side boot-strap capacitor control circuit, wherein during a dead time of a switching period, the first terminal of the high side boot-strap capacitor is coupled to the high side ground reference, and the second terminal of the high side boot-strap capacitor is coupled to a first current source, and wherein the dead time is a time period during when the high side power switch and the low side power switch are both turned off;

a low side boot-strap capacitor control circuit, coupled between a low side power supply and a low side ground reference, wherein the low side boot-strap capacitor control circuit receives the low side boot-strap capacitor control signal set, and provides a low side power signal to a control terminal of the low side power switch; and a low side boot-strap capacitor, having a first terminal coupled to the control terminal of the low side power switch, and a second terminal coupled to the low side boot-strap capacitor control circuit, wherein during the dead time of the switching period, the first terminal of the low side boot-strap capacitor is coupled to the low side ground reference, and the second terminal of the low side boot-strap capacitor is coupled to a second current source.

13. The switching converter of claim 12, wherein the high side boot-strap capacitor control signal set comprises a first switching signal, a second switching signal, a third switching signal and a fourth switching signal, and wherein the high side boot-strap capacitor control circuit comprises:

a first switch, coupled between the high side power supply and the second terminal of the high side boot-strap capacitor, wherein the first switch has a control terminal configured to receive the first switching signal;

a second switch, coupled between the second terminal of the high side boot-strap capacitor and the high side ground reference, and wherein the second switch has a control terminal configured to receive the second switching signal;

the first current source, coupled between the high side power supply and the second terminal of the high side boot-strap capacitor, wherein the first current source has a control terminal configured to receive the third switching signal;

a fourth switch, coupled between the first terminal of the high side boot-strap capacitor and the high side ground reference, wherein the fourth switch has a control terminal configured to receive the fourth switching signal; and a first clamping circuit, coupled in parallel with the high side boot-strap capacitor, wherein the first clamping circuit keeps a voltage across the high side boot-strap capacitor unchanged except for a time period during when the high side boot-strap capacitor is charged by the first current source.

14. The switching converter of claim 13, wherein the first switching signal has a same phase with the high side control signal, and the second switching signal has a same phase with the low side control signal, and wherein the logic circuit comprises:

a first NOR gate, configured to receive the high side control signal and the low side control signal, and to provide the third switching signal and the fourth switching signal.

15. The switching converter of claim 13, wherein the first switching signal has a same phase with the high side control signal, and the second switching signal has a same phase with the low side control signal, and wherein the logic circuit comprises:

a first NOR gate, configured to receive the high side control signal and the low side control signal, and to provide the fourth switching signal;

a first comparator, configured to receive a high side boot-strap capacitor voltage and a first reference voltage, and to provide a first comparing signal based on a comparison result of the high side boot-strap capacitor voltage and the first reference voltage; and a first AND gate, configured to receive the fourth switching signal and the first comparing signal, and to provide the third switching signal.

16. The switching converter of claim 12, wherein the low side boot-strap capacitor control signal set comprises a fifth switching signal, a sixth switching signal, a seventh switching signal and an eighth switching signal, and wherein the low side boot-strap capacitor control circuit comprises:

a fifth switch, coupled between the low side power supply and the second terminal of the low side boot-strap capacitor, wherein the fifth switch has a control terminal configured to receive the fifth switching signal;

a sixth switch, coupled between the second terminal of the low side boot-strap capacitor and the low side ground reference, and wherein the sixth switch has a control terminal configured to receive the sixth switching signal;

the second current source, coupled between the low side power supply and the second terminal of the low side boot-strap capacitor, wherein the second current source has a control terminal configured to receive the seventh switching signal;

an eighth switch, coupled between the first terminal of the low side boot-strap capacitor and the low side ground reference, wherein the eighth switch has a control terminal configured to receive the eighth switching signal; and a second clamping circuit, coupled in parallel with the low side boot-strap capacitor, wherein the second clamping circuit keeps a voltage across the low side boot-strap capacitor unchanged except for a time period during when the low side boot-strap capacitor is charge by the second current source.

17. The switching converter of claim 16, wherein the sixth switching signal has a same phase with the high side control signal, and the fifth switching signal has a same phase with the low side control signal, and wherein the logic circuit comprises:
- a second NOR gate, configured to receive the high side control signal and the low side control signal, and to provide the seventh switching signal and the eighth switching signal.

18. The switching converter of claim 16, wherein the sixth switching signal has a same phase with the high side control signal, and the seventh switching signal has a same phase with the low side control signal, and wherein the logic circuit comprises:
- a second NOR gate, configured to receive the high side control signal and the low side control signal, and to provide the eighth switching signal;
- a second comparator, configured to receive a low side boot-strap capacitor voltage and a second reference voltage, and to provide a second comparing signal based on a comparison result of the low side boot-strap capacitor voltage and the second reference voltage; and
- a second AND gate, configured to receive the eighth switching signal and the second comparing signal, and to provide the seventh switching signal.

19. A control circuit for controlling a power switch having a control terminal coupled to a first terminal of a boot-strap capacitor, wherein the power switch is used with a switching converter having a complementary power switch turned on and off alternately with the power switch, the control circuit comprising:
- a boot-strap capacitor control circuit, coupled between a power supply and a ground reference, wherein the boot-strap capacitor control circuit comprises:
  - a first switch;
  - a second switch, coupled in series with the first switch between the power supply and the ground reference;
  - a current source, coupled in parallel with the first switch between the power supply and a second terminal of the boot-strap capacitor; and
  - a fourth switch, coupled between a control terminal of the power switch and the ground reference; wherein the first switch and the second switch are turned on and off alternately, and wherein during a dead time when the power switch and the complementary power switch are both off in a switching period, the first switch and the second switch are turned off, the fourth switch is turned on, and the boot-strap capacitor is charged by the current source.

20. The control circuit of claim 19, further comprising the boot-strap capacitor having the first terminal coupled to the control terminal of the power switch, and the second terminal coupled to a connection node of the first switch and the second switch.

21. The control circuit of claim 19, wherein the boot-strap capacitor control circuit further comprises:
- a clamping circuit, coupled in parallel with the boot-strap capacitor, wherein the clamping circuit keeps a voltage across the boot-strap capacitor unchanged except for the dead time.

22. The control circuit of claim 19, further comprising:
- a logic circuit, configured to receive a control signal for controlling the power switch, and a complementary control signal for controlling the complementary power switch, and to provide a first switching signal, a second switching signal, a third switching signal and a fourth switching signal for respectively controlling the first switch, the second switch, the current source and the fourth switch.

23. The control circuit of claim 22, wherein the current source comprises a third switch having a control terminal configured to receive the third switching signal.

24. The control circuit of claim 23, wherein the current source further comprises a resistor, coupled in series with the third switch.

25. The control circuit of claim 22, wherein the first switching signal has a same phase with the control signal, and the second switching signal has a same phase with the complementary control signal, and wherein the logic circuit comprises:
- an NOR gate, configured to receive the control signal and the complementary control signal, and to provide the third switching signal and the fourth switching signal having the same phases.

26. The control circuit of claim 22, wherein the first switching signal has a same phase with the control signal, and the second switching signal has a same phase with the complementary control signal, and wherein the logic circuit comprises:
- an NOR gate, configured to receive the control signal and the complementary control signal, and to provide the fourth switching signal;
- a comparator, configured to receive a boot-strap capacitor voltage across the boot-strap capacitor and a reference voltage, and to provide a comparing signal based on a comparison result of the boot-strap capacitor voltage and the reference voltage; and
- an AND gate, configured to receive the fourth switching signal and the comparing signal, and to provide the third switching signal.

* * * * *